United States Patent
Gratrex et al.

(10) Patent No.: US 7,173,874 B2
(45) Date of Patent: Feb. 6, 2007

(54) COMPACT DECODE AND MULTIPLEXING CIRCUITRY FOR A MULTI-PORT MEMORY HAVING A COMMON MEMORY INTERFACE

(75) Inventors: Alistair Gratrex, Berkshire (GB); Graham Kirsch, Tadley (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/200,942

(22) Filed: Aug. 9, 2005

(65) Prior Publication Data

US 2006/0023525 A1    Feb. 2, 2006

Related U.S. Application Data

(60) Division of application No. 10/928,415, filed on Aug. 27, 2004, now Pat. No. 7,020,042, which is a continuation of application No. 10/746,095, filed on Dec. 26, 2003, now Pat. No. 6,788,613.

(30) Foreign Application Priority Data

Jul. 3, 2003    (GB) ................... 0315630.4

(51) Int. Cl.
*G11C 8/16*    (2006.01)
(52) U.S. Cl. ............... 365/230.05; 365/230.06; 365/189.05; 365/230.03
(58) Field of Classification Search ........... 365/230.05, 365/230.06, 230.03, 189.05
See application file for complete search history.

(56) References Cited

U.S. PATENT DOCUMENTS

| | | | |
|---|---|---|---|
| 4,652,993 A | 3/1987 | Scheuneman et al. | 711/151 |
| 4,937,781 A | 6/1990 | Lee et al. | 711/149 |
| 4,975,597 A | 12/1990 | Houston | 326/108 |
| 5,187,684 A | 2/1993 | Hoshino | 365/189.05 |
| 5,303,200 A | 4/1994 | Elrod et al. | 365/230.05 |
| 5,319,768 A | 6/1994 | Rastegar | 711/131 |
| 5,475,631 A | 12/1995 | Parkinson et al. | 712/15 |
| 5,903,510 A | 5/1999 | Kodama | 365/230.06 |
| 5,940,603 A | 8/1999 | Huang | 716/5 |
| 5,968,114 A | 10/1999 | Wentka et al. | 718/100 |
| 6,189,073 B1 | 2/2001 | Pawlowski | 711/120 |
| 6,560,160 B1 | 5/2003 | Grace | 365/230.05 |

(Continued)

FOREIGN PATENT DOCUMENTS

EP    0 496 391 A3    7/1992

(Continued)

*Primary Examiner*—Andrew Q. Tran
(74) *Attorney, Agent, or Firm*—Dorsey & Whitney LLP (57) ABSTRACT

A memory array for a multi-port memory having a common memory interface and a plurality of memory ports through which the memory array is accessed is provided. The memory array includes (r·s·t) memory locations with the memory array organized as a first memory sub-array accessible through a first of the plurality of memory ports as a (m×t) memory array and organized as a second memory sub-array accessible through a second of the plurality of memory ports as a (n×t) memory array. Both m and n are multiples of a value r, and the sum of (m/r) and (n/r) is equal to s. The memory array further organized as a common memory array accessible through the common memory interface as a (r×s×t) memory array.

5 Claims, 6 Drawing Sheets

U.S. PATENT DOCUMENTS 6,765,818 B2    7/2004    Kanzaki et al. ............. 365/154
7,020,042 B2 *   3/2006    Gratrex et al. ......... 365/230.05
7,068,563 B2 *   6/2006    Gratrex et al. ......... 365/230.06
7,075,850 B2 *   7/2006    Gratrex et al. ......... 365/230.05

FOREIGN PATENT DOCUMENTS

WO    WO 02/052577 A1    7/2002

* cited by examiner

COMPACT DECODE AND MULTIPLEXING CIRCUITRY FOR A MULTI-PORT MEMORY HAVING A COMMON MEMORY INTERFACE

CROSS-REFERENCE TO RELATED APPLICATIONS

This application is a divisional of pending U.S. patent application Ser. No. 10/928,415, filed Aug. 27, 2004, now U.S. Pat. No. 7,020,042, which is a continuation of U.S. patent application Ser. No. 10/746,095, filed Dec. 26, 2003, issued Sep. 7, 2004 as U.S. Pat. No. 6,788,613 B1, which claims the benefit of United Kingdom Patent Application No. 0315630.4, filed Jul. 3, 2003.

TECHNICAL FIELD

The present invention relates to multi-port memories, and more specifically, relates to a compact decode and multiplexing circuitry for a multi-port memory having a common memory interface.

BACKGROUND OF THE INVENTION

Multi-port memories are used in a variety of applications. In one application, multi-port static random access memory (SRAM) arrays are used as memory buffers between logic circuitry and slower dynamic random access memory (DRAM). Conventionally, the SRAM arrays used in these types of applications are two-port memories having two independently accessible ports. This allows for memory locations in the SRAM to be accessed by the logic circuitry through one of the two ports in order to free the logic circuitry from having to wait to complete memory accesses to the slower DRAM, and further allows the DRAM to access the SRAM through the other port to update any data.

Figure 1:
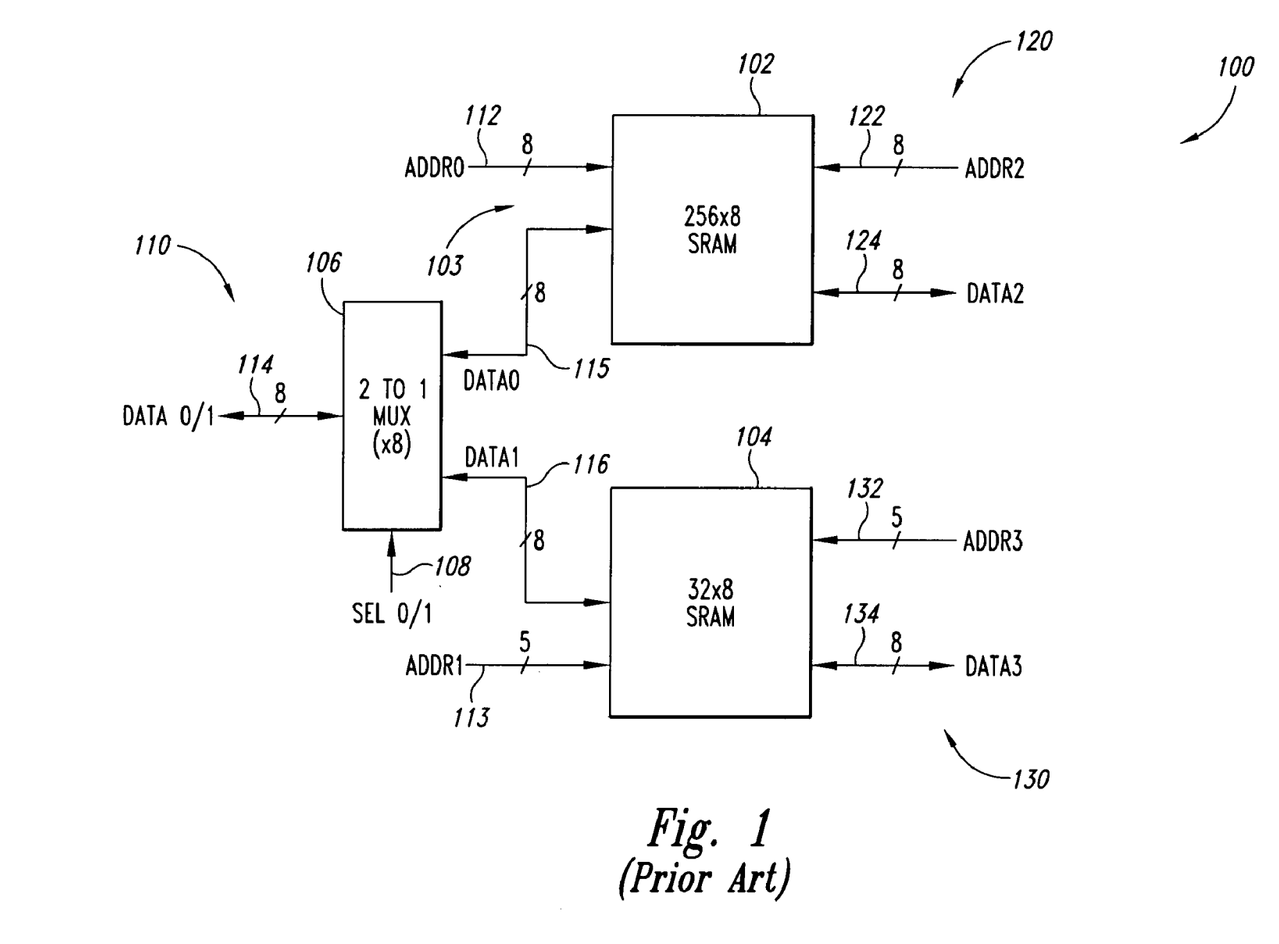
FIG. 1 is a functional block diagram of a conventional multi-port memory.

FIG. 1 shows a conventional multi-port memory 100 having two two-port memory arrays 102, 104 sharing a common interface, represented by address terminals 112, 113 and common data bus 114. As shown in FIG. 1, the memory arrays 102, 104 are configured as a 256×8 SRAM array and a 32×8 SRAM array. The memory arrays 102, 104 can be embedded SRAM arrays formed on a single die with additional logic circuitry (not shown). The two-port memory arrays 102, 104 each have one memory port 120, 130, that provides access to the respective memory arrays. Although not shown in FIG. 1, respective logic circuitry can be coupled to each port to access the memory arrays 102, 104. Each port 103, 105, 120, 130 has its own decode circuitry (not shown) to decode the memory address provided over a respective address terminal to provide access to the memory array through the respective port. The memory port 120 is represented by address terminal 122 and data input/output 124, and the memory port 130 is represented by address terminal 132 and data input/output 134. Each multi-port memory array 102, 104 also has a second memory port 103, 105 that also provides access to each memory array 102, 104. However, each data port is coupled to a multiplexer 106 to be accessed through the common memory interface 110. The common interface 110 can be coupled to DRAM so that the multi-port memory 100 can be used as a memory buffer between any logic circuitry and the DRAM. As shown in FIG. 1, the data buses 115, 116 from each of the memory arrays 102, 104 are routed to the multiplexer 106 for selection of which of the data busses 115, 116, to couple to the common data bus 114 for access. Selection of which of the data busses 115, 116 is based on a selection signal SEL0/1 provided to the multiplexer 106 through a selection terminal 108.

Several issues arise in forming multi-port memories having a common memory interface from conventional two-port memories. For example, where the multi-port memory 100 is implemented as an embedded memory, forming byte-wide data busses for each memory array consumes precious space on a semiconductor die. The problem is exacerbated for byte-wide multi-port memories having several memory ports in addition to the common memory interface 110. Additionally, as previously discussed, each port of a two-port memory has respective decode circuitry and requires a common multiplexer for coupling to a common memory interface. This circuitry further consumes space on the semiconductor die. Moreover, the number and length of conductive lines forming the multiple data busses may result in significant loading effects caused by signal line impedance and cross coupling. Another issue with the conventional multi-port memory 100, is that by including a multiplexer in the data path, such as the multiplexer 106, timing constraints for the multi-port memory are increased since propagation delays through the multiplexer 106 and the need to ensure signal integrity add to memory access times. Typically, memory access times are relaxed to accommodate any timing delays caused by the multiplexer 106. However, increasing memory access times is viewed as a very undesirable solution.

Therefore, there is a need for an alternative multiplexing scheme for a multi-port memory having a common memory interface shared by the multiple memory arrays of the multi-port memory.

SUMMARY OF THE INVENTION

According to one aspect of the invention, a multi-port memory is provided. The multi-port memory includes a first memory cell array having memory cells arranged in at least one memory segment and a first address decoder circuit that is coupled to the first memory cell array to decode first address signals for accessing memory cells of the first memory cell array. The memory further includes a second memory cell array having memory cells arranged in at least one memory segment having the same number of memory cells as the memory segment of the first memory cell array and a second address decoder circuit that is coupled to the second memory cell array to decode second address signals for accessing memory cells of the second memory cell array. A third address decoder circuit is coupled to the first and second memory cell arrays and decodes third address signals for accessing memory cells of the first or second memory cell array. Each set of third address signals decoded by the third address decoder circuit accesses memory cells of one of the memory segments of the first or second memory cell array.

According to another aspect of the invention, a multi-port memory having first and second memory cell arrays and first, second, and third input/output (I/O) circuits is provided. The first memory cell array includes memory cells arranged in at least one memory segment and the second memory cell array includes memory cells arranged in at least one memory segment having the same number of memory cells as the memory segment of the first memory cell array. The first I/O circuit is coupled to the first memory cell array and couples data between the first memory cell array and a first one of a plurality of memory ports in response to accessing memory cells of the first memory cell array. The second I/O circuit is coupled to the second memory cell array and couples data between the second memory cell array and a second one of the plurality of memory ports in response to accessing memory cells of the second memory cell array. The third I/O circuit is coupled to the first and second memory cell arrays and couples data between one of the memory segments of the first or second memory cell array and a common memory interface in response to accessing memory cells of the first or second memory cell array through the common memory interface.

DETAILED DESCRIPTION OF THE INVENTION

Figure 2:
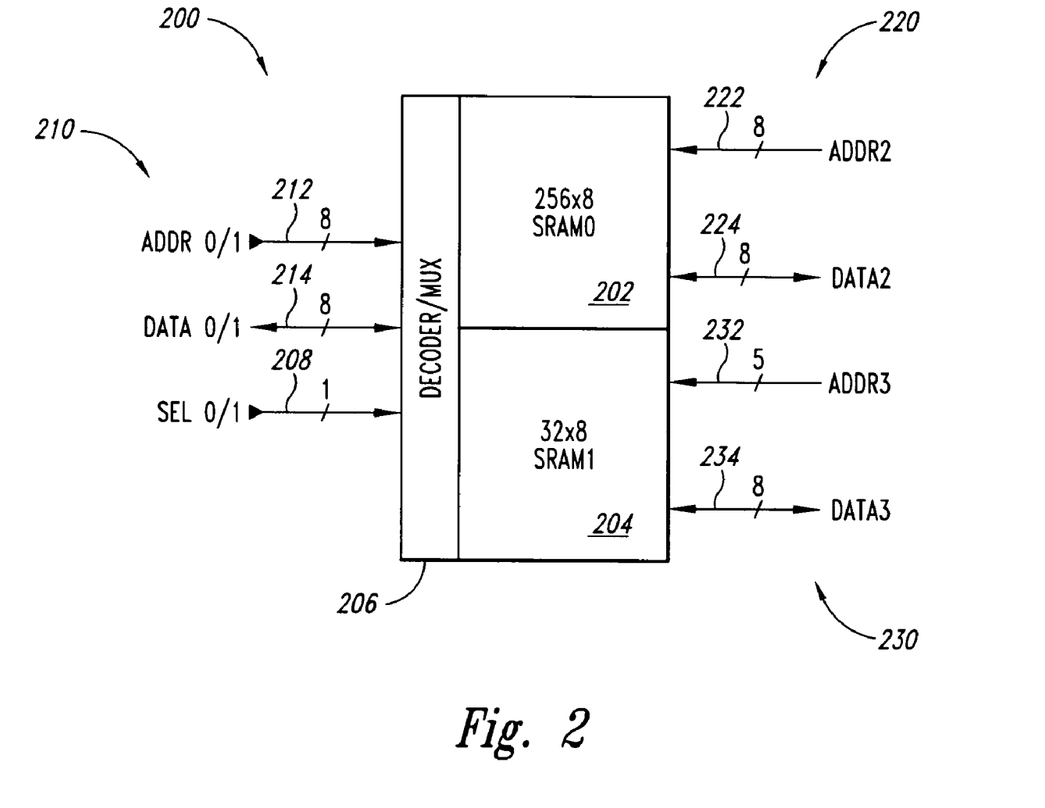
FIG. 2 is a functional block diagram of a multi-port memory according to an embodiment of the present invention.

FIG. 2 shows a multi-port memory device 200 according to an embodiment of the present invention. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 3:
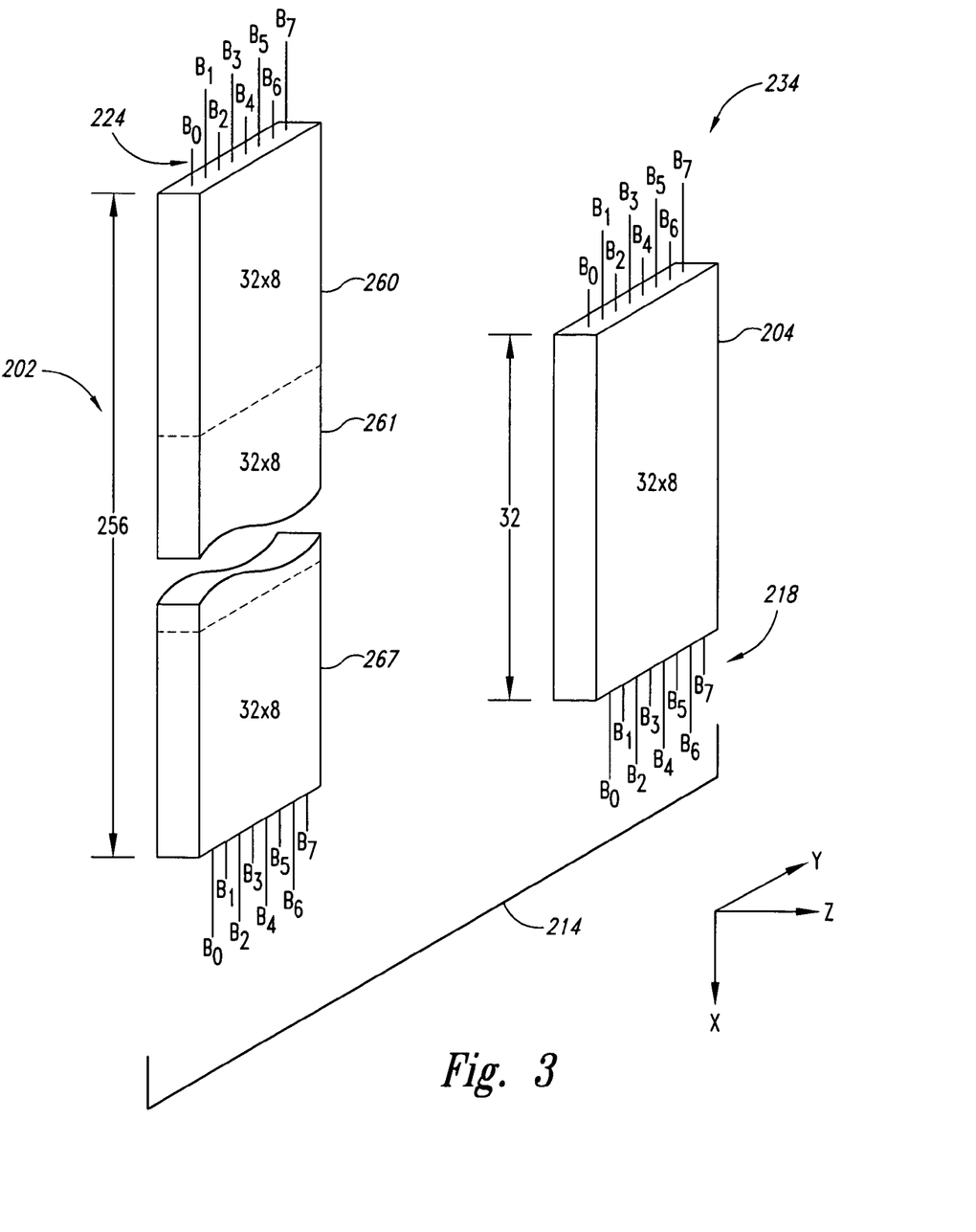
FIG. 3 is a diagram illustrating a memory configuration of memory arrays of the multi-port memory of FIG. 2.

The multi-port memory 200 is a three-port memory having memory ports 210, 220, 230, and having two memory arrays 202, 204. In an embodiment of the present invention, the multi-port memory 200 is implemented as an embedded memory in a integrated circuit having additional logic circuitry (not shown) coupled to the multi-port memory 200, and the memory arrays 202, 204 are arrays of SRAM memory cells. It will be appreciated, however, that the specific implementation of the multi-port memory 200, whether as an embedded memory or as a discrete memory device, can be modified without departing from the scope of the present invention. Moreover, the memory arrays can be of memory cells other than SRAM memory cells, such as DRAM memory cells, or in an alternative embodiment, non-volatile memory cells. The memory array 202 is arranged as a 256×8 memory array and the memory array 204 is arranged as a 32×8 memory array. As well known, to address a 256×8 memory array, an eight bit address is required, and to address a 32×8 memory array, a five bit address is required. Each of the ports 210, 220, 230 include an address input 212, 222, 232, and data input/output 214, 224, 234, all respectively. Each of the memory ports 220, 230 can be coupled to a respective address and data bus through which each memory array 202, 204 can be independently accessed. As shown in FIG. 3, the memory port 220 provides access to the memory array 202 and the memory port 230 provides access to the memory array 204. In contrast, the memory port 210 is a common memory port that is shared between the memory arrays 202, 204 and through which the combined memory of the memory arrays 202, 204 can be accessed. The common address input 212 and data input/output 214 is decoded and multiplexed between the memory arrays 202, 204 by decode/multiplexing circuitry 206 under the control of a selection signal SEL0/1 that is applied to a selection input 208.

As will be described in more detail below, although the organization of the memory array 202 accessed through the memory port 220 is shown as being 256×8, and the organization of the memory array 204 accessed through the memory port 230 is shown as being 32×8, the memory arrays 202, 204 can be accessed as a single 32×9×8 memory array through the common memory port 210. The decoding and multiplexing circuitry 206 provides a compact multiplexing scheme that is employed by the multi-port memory 200 to provide the 32×9×8 memory organization and avoid the need for parallel data busses routed to a conventional multiplexer, as previously described for conventional multi-ported memories using multiple two-port memory arrays.

By using the manner of multiplexing of the multi-port memory 200, only three sets of decoding circuitry is needed (i.e., one set for each port 210, 220, 230) in comparison to conventional designs where four sets of decoding circuitry is typically used. Thus, having one less set of decoding circuitry will save space on the die. Additionally, because the multiplexing of the multi-port memory 200 leverages existing array decoding circuitry, an external multiplexer is not needed, such as with conventional designs. Thus, further space savings are provided, as well as removing timing constraints otherwise resulting from an external mutliplexer.

As shown in FIG. 2, and as will explained in greater detail below, an eight bit address plus the one bit SEL0/1 signal, are required to address the 32×9×8 memory array. Although not shown in FIG. 2, conventional address decoding circuitry can be used in the multi-port memory 200 to decode the memory addresses provided on address inputs 212, 222, 232 for access to the memory arrays 202, 204. Suitable decoding circuitry is well known to those ordinarily skilled in the art, and have not been described in detail herein in the interest of brevity. Nevertheless, those ordinarily skilled in the art will obtain sufficient understand from the description provided herein to practice embodiments of the present invention.

FIG. 3 illustrates a logical organization of the memory arrays 202, 204 in the multi-port memory 200. As shown in FIG. 3, each of the memory arrays 202, 204 have two ×8 data input/outputs. That is, the memory array 202 includes the ×8 data input/output 224 that is associated with the data port 220 and further includes a ×8 data input/output 216 that represents one of the two input/outputs of the common data input/output 214. The memory array 204 includes the ×8 data input/output 234 that is associated with the data port 230 and further includes a ×8 data input/output 218 that represents the second of the two input/outputs of the common data input/output 214. As previously discussed, the memory array 202 is accessible through the data port 220 as a 256×8 memory array and the memory array 204 is accessible through the data port 230 as a 32×8 memory array. However, the combined memory array of 202, 204 can also be accessed through the common data port 210 and the decode/multiplexing circuitry 206 as a 32×9×8 memory array using the compact multiplexing scheme described in more detail below.

Figure 4:
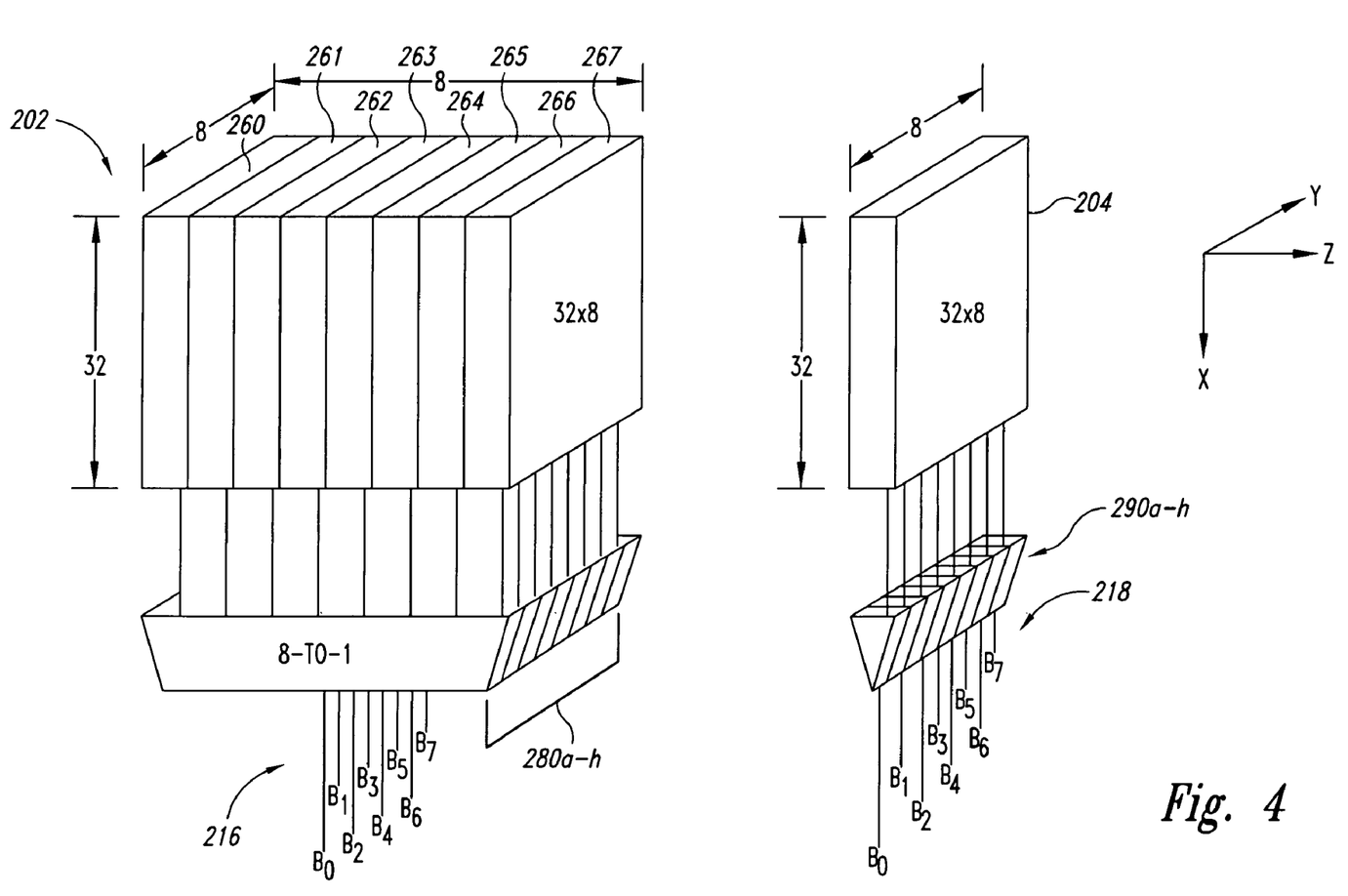
FIG. 4 is a diagram illustrating a memory configuration of memory arrays of the multi-port memory of FIG. 2 according to an embodiment of the present invention.

FIG. 3 illustrates the memory array 202 logically segmented into several 32×8 memory segments. Although a 256×8 memory array provides eight 32×8 segments, only 32×8 memory segments 260, 261, 267 are shown in FIG. 3. FIG. 4 illustrates the multiple 32×8 segments 260–267 of the memory array 202 logically arranged in a 32×8×8 organization. Each of the 32×8 segments 260–267 has an 8-bit wide data input/output coupled to a multiplexer 280. The multiplexer 280 is arranged as eight adjacent 8-to-1 multiplexers 280a–h. The eight input/outputs of the mutliplexer 280 represent the ×8 data input/output 216. The 32×8 memory array 204 also has an 8-bit wide data input/output, but is coupled to a data input/output buffer 290 arranged as eight adjacent input/output buffers 290a–h. Each input/output buffer 290a–h represents one bit of the ×8 data input/output 218 of the memory array 204.

Figure 5:
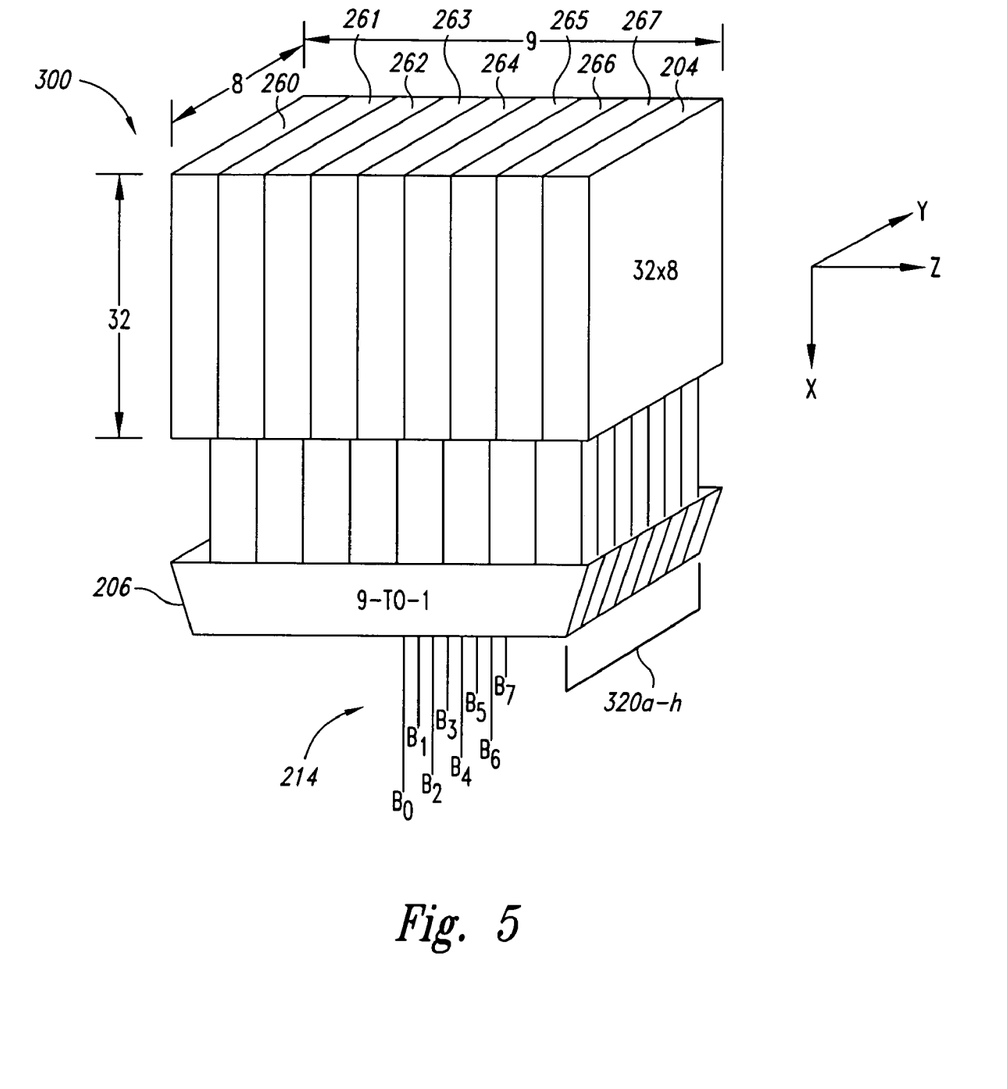
FIG. 5 is a diagram illustrating a memory configuration of memory arrays and multiplexing scheme of the multi-port memory of FIG. 2 according to an embodiment of the present invention.

Whereas FIG. 4 illustrates the memory arrays 202, 204 as separate memory arrays, that is, one logically organized as a 32×8×8 memory array and the other organized as a 32×8 memory array, FIG. 5 illustrates a combined memory array 300 logically organized as a 32×9×8 memory array. Comparing FIGS. 4 and 5, the memory array 204 is merely added to the memory array 202 logically organized as a 32×8×8 memory array, resulting in the combined memory array 300. Each of the eight 32×8 memory segments 260–267, as well as the memory array 202, has an 8-bit wide input/output coupled to a 9-to-1 multiplexer 320. The multiplexer 320 represents circuitry included in the decoding/multiplexing circuitry 206, shown in FIG. 2. The multiplexer 320 includes eight adjacent 9-to-1 multiplexers 320a–h. The input/output of the 9-to-1 multiplexer 320a–h represents the 8-bit wide common data input/output 214 of the common memory port 210 (FIG. 2). The 9-to-1 multiplexer 320 combines the 8-to-1 multiplexer 280 and the input/output buffer 290 shown in FIG. 4. The 9-to-1 multiplexer 320 can be implemented using conventional designs and circuitry well known by those ordinarily skilled in the art.

With respect to addressing the memory array 300, it will be appreciated by those ordinarily skilled in the art that in order to address one of the 32 rows of each of the memory segments/array 260–267, 204, a five bit address is required. Moreover, three additional address bits and the single bit SEL0/1 signal can be used for selecting eight memory locations through the 9-to-1 multiplexer 320 for access. For example, with reference to FIG. 4, three address bits (not shown) can be used to select one of the eight memory segments 260–267 through the 8-to-1 multiplexer 280 and the SEL0/1 signal can be used to select either the data input/output 216 or the data input/output 214.

The compact arrangement of the 9-to-1 multiplexer 320 allows the memory arrays 202, 204 to be logically organized as a 32×9×8 memory array that is accessible through the common memory port 210, while still being individually accessible through the memory ports 220, 230 as memory arrays having different memory organizations, namely, arranged as 256×8 and 32×8 memory arrays. It will be appreciated that although the data input/outputs 224, 234 of the memory ports 220, 230 are not shown in FIGS. 4 and 5, the memory arrays 202, 204 still accessible through the respective memory ports in the logical organization of the individual memory arrays 202, 204 as shown in FIG. 2. The data input/outputs 224, 234 have been omitted from FIGS. 4 and 5 to avoid unnecessarily complicating the respective figures.

In operation, when the memory array 300 is accessed (through the memory port 210 and decode/multiplexing circuitry 206), the same row in each of the memory segments 260–267 and the memory array 204 is activated. As previously discussed, a row of memory runs parallel to the y-axis, and the columns of memory run parallel to the x-axis. As a result, when a row of memory is activated, the eight memory locations at the intersection of the activated row and the columns of a memory segment/array will be accessed. Since a row of memory in each of the memory segments/array 260–267, 204 is activated, the eight memory locations of each of the memory segments/array 260–267, 204 are coupled to the 9-to-1 multiplexer 320 to be accessed. Conceptually, the 72 memory locations (i.e., 8 memory locations per memory segment/array×9 memory segments/array) are located in a plane parallel to the y-z plane.

The eight memory locations of a memory segment/array are coupled to a respective one of the eight adjacent 9-to-1 multiplexers. Additionally, the memory locations corresponding to the same bit position of the nine memory segments/array 260–267/204 are coupled to the same 9-to-1 multiplexer. For example, upon the activation of a row of memory, the memory segment 260 will couple the eight memory locations corresponding to eight bit positions B0–B7 to a respective one of the eight adjacent 9-to-1 multiplexers 320a–h. That is, B0 of the memory segment 260 is coupled to the 9-to-1 multiplexer 320a, B1 is coupled to the 9-to-1 multiplexer 320b, B2 is coupled to the 9-to-1 multiplexer 320c, and continues for each bit through B7 coupled to the 9-to-1 multiplexer 320h. Similarly, the memory segment 261 will couple the eight memory locations corresponding to the eight bit positions B0–B7 to a respective one of the eight adjacent 9-to-1 multiplexers 320a–h. The remaining memory segments 262–267 and the memory array 204 will likewise coupled each of the eight memory locations corresponding to the bit positions B0–B7 to a respective one of the eight adjacent 9-to-1 multiplexers 320a–h. As a result, the memory locations corresponding to the bit position B0 from each of the nine memory segments/array 260–267, 204 are coupled to the 9-to-1 multiplexer 320a. Similarly, the memory locations corresponding to the bit position B1 from each of the nine memory segments/array 260–267, 204 are coupled to the 9-to-1 multiplexer 320b. The remaining memory locations corresponding to the bit positions B2–B7 from each of the nine memory segments/array 260–267, 204 are coupled to a respective one of the 9-to-1 multiplexers 320c–h. In this manner, although 72 memory locations are coupled to the 9-to-1 multiplexer 320 upon the activation of a row of memory, eight memory locations from only one of the nine memory segments/array 260–267/204 are selected by the 9-to-1 multiplexer 320 to be coupled to the common data input/output 214 for access.

It will be appreciated that the details of the embodiment described with respect to FIGS. 2–5 have been provided by way of example, and that modifications can be made without departing from the scope of the present invention. More specifically, it will be appreciated that the memory capacity and configuration of memory arrays of a multi-port memory having a compact multiplexing scheme according to an embodiment of the present invention can be modified from the example provided by FIGS. 2–5. For example, in the previously described embodiment, the memory array 202 was logically segmented into eight 32×8 memory segments and combined with the 32×8 memory array 204 using a 9-to-1 multiplexer. However, in an alternative embodiment, the 32×8 memory array 204 is replaced by a 64×8 memory array. The 64×8 memory array can be logically segmented into two 32×8 memory segments, and combined with the eight 32×8 segments of the 256×8 memory array 202 by using multiplexer having eight adjacent 10-to-1 multiplexers to form a 32×10×8 memory array accessible through the common memory port. In addition to changing the configuration of the memory arrays, memory arrays of different widths can be used in alternative embodiments, such as ×16 or ×32 memory arrays. Additionally, the relative sizes of the memory arrays 202, 204 can be changed from that previously described without departing from the scope of the present invention. In alternative embodiments of the present invention, a multi-port memory includes more than two memory arrays and more than three memory ports. For example, embodiments of the present invention can be used to provide a multi-port memory having three memory arrays and four separate memory ports. Making such modifications are well within the understanding of those ordinarily skilled in the art. Additionally, those ordinarily skilled in the art will obtain sufficient understanding from the description provided herein to enable one to practice various embodiments of the present invention.

Figure 6:
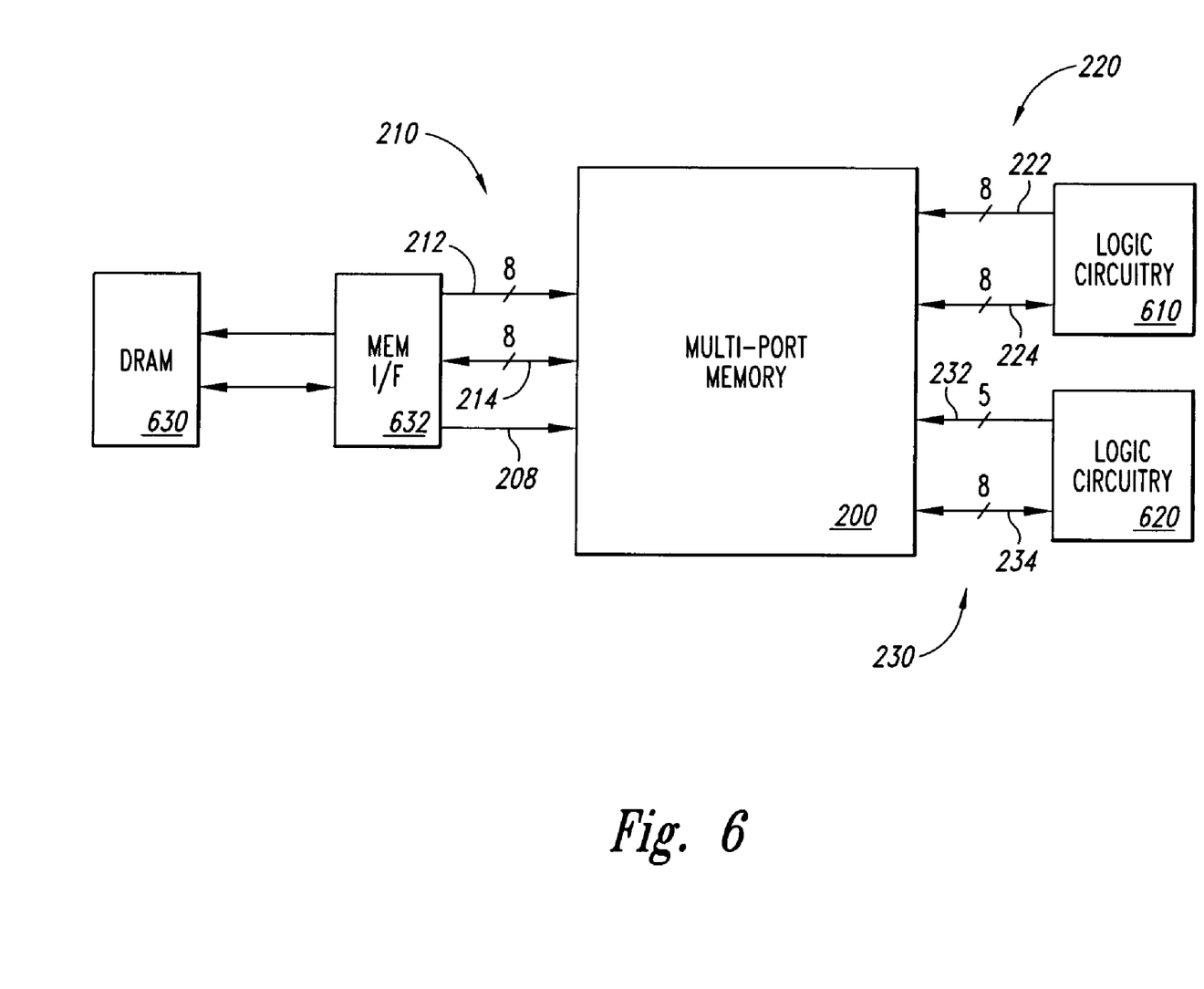
FIG. 6 is a processing system having a multi-port memory according to an embodiment of the present invention.

FIG. 6 illustrates a processing system 600 having multi-port memory according to an embodiment of the present invention. The multi-port 200 is used as a memory buffer between logic circuitry 610, 620 and DRAM 630. The logic circuitry 610 is coupled to the memory port 220 and the logic circuitry 620 is coupled to the memory port 230. Coupled to the common port 210 is a memory interface circuit 632 and the DRAM 630. The memory interface 632 provides the appropriate control and address signals to both the DRAM 630 and the multi-port memory 200 to transfer data between the two. The logic circuitry 610, 620 represent various circuitry that can be coupled to the two independent memory ports 220, 230 for access to the multi-port memory 200. For example, in one embodiment, the logic circuitry 610 is processing circuitry for processing instructions and data stored in the memory array to which the memory port 220 provides access and the logic circuitry 620 represents external input/output circuitry that reads and writes data to the memory array through which the memory port 230 provides access. In an alternative embodiment, both the logic circuitry 610, 620 represent processing circuitry. It will be appreciated, however, that the logic circuitry 610, 620 can represent other types of circuitry well known in the art without departing from the scope of the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A multi-port memory having a common memory interface and a plurality of memory ports through with the memory is accessed, the multi-port memory including first and second memory cell arrays, the multi-port memory comprising:
    a first address decoder circuit coupled to the first memory cell array and configured to decode first address signals for accessing memory cells of the first memory cell array;
    a first input/output (I/O) circuit coupled to the first memory cell array, the first address decoder circuit, and a first one of the plurality of memory ports, the first I/O circuit configured to couple data between the first memory cell array and the first one of the plurality of memory ports in response to accessing memory cells of the first memory cell array through the first one of the plurality of memory ports;
    a second address decoder circuit coupled to the second memory cell array and configured to decode second address signals for accessing memory cells of the second memory cell array;
    a second I/O circuit coupled to the second memory cell array, the second address decoder circuit, and the a second one of the plurality of memory ports, the second I/O circuit configured to couple data between the second memory cell array and the second one of the plurality of memory ports in response to accessing memory cells of the second memory cell array through the second one of the plurality of memory ports;
    a third address decoder circuit coupled to the first and second memory cell arrays and configured to decode third address signals for accessing memory cells of the first or second memory cell array, the third address decoder circuit decoding the same number of address signals for accessing memory cells of the first memory cell array as for accessing the memory cells of the second memory cell array; and
    a third I/O circuit coupled to the first and second memory cell arrays, the third address decoder, and the common memory interface, the third I/O circuit configured to couple data between memory cells of either the first or second memory cell array and the common memory interface in response to accessing memory cells of the first or second memory cell array through the common memory interface.

2. The multi-port memory of claim 1 wherein the first and second memory cell arrays comprise memory arrays of static random access memory cells.

3. The multi-port memory of claim 1 wherein the first and second memory cell arrays comprise embedded memory cell arrays.

4. The multi-port memory of claim 1 wherein the first I/O circuit, the second I/O circuit, and the third I/O circuits are configured to couple the same number of bits of data to the first one of the plurality of memory ports, the second one of the plurality of memory ports, and the common memory interface, respectively, in response to accessing the first and second memory cells array.

5. The multi-port memory of claim 1 wherein the first address decoder is configured to decode a first number of address signals and the second address decoder is configured to decode a second number of address signals, and the third address decoder is configured to decode a third number of address signals, the sum of the first and second numbers greater than the third number.

* * * * *